United States Patent
Gengler

(10) Patent No.: US 11,134,580 B2
(45) Date of Patent: Sep. 28, 2021

(54) PROTECTIVE COVER FOR PORTABLE ELECTRONIC DEVICE AND ASSOCIATED SYSTEMS AND METHODS

(71) Applicant: ZAGG Intellectual Property Holding Co., Inc., Salt Lake City, UT (US)

(72) Inventor: David Gengler, Draper, UT (US)

(73) Assignee: ZAGG Inc, Midvale, UT (US)

(*) Notice: Subject to any disclaimer, the term of this patent is extended or adjusted under 35 U.S.C. 154(b) by 10 days.

(21) Appl. No.: 13/920,439

(22) Filed: Jun. 18, 2013

(65) Prior Publication Data

US 2013/0279096 A1 Oct. 24, 2013

Related U.S. Application Data

(63) Continuation-in-part of application No. 12/954,841, filed on Nov. 26, 2010, now abandoned, which is a
(Continued)

(51) Int. Cl.
*H05K 7/00* (2006.01)
*H05K 13/00* (2006.01)
(Continued)

(52) U.S. Cl.
CPC ............ *H05K 7/00* (2013.01); *G06F 1/1626* (2013.01); *G06F 1/1669* (2013.01);
(Continued)

(58) Field of Classification Search
CPC ............ A45C 11/00; A45C 2011/002; A45C 2011/003; A45C 2200/15; G06F 1/1628;
(Continued)

(56) References Cited

U.S. PATENT DOCUMENTS

| X289652 | 12/1883 | Haynes |
| 2,896,525 A | 12/1883 | Haynes |
| | (Continued) | |

FOREIGN PATENT DOCUMENTS

| DE | 20101039 U1 | 5/2001 |
| EP | 0539099 A2 | 4/1993 |
| | (Continued) | |

OTHER PUBLICATIONS

United States Patent and Trademark Office as the International Searching Authority, "International Search Report and Written Opinion of the International Searching Authority," dated Nov. 16, 2011, in related PCT application No. PCT/US2011/043450.
(Continued)

*Primary Examiner* — Angel R Estrada
(74) *Attorney, Agent, or Firm* — Dentons Durham Jones Pinegar

(57) ABSTRACT

A protective cover is provided to protect a portable electronic device, including a display surface that includes a display screen. The protective cover may include a computing accessory such as a keyboard. One or more magnets in the protective cover may be configured to align with magnets located in the portable electronic device. Upon placing the protective cover over the display surface, an attraction force between magnets can secure the protective cover, including the computing accessory, over the display surface. The magnets may be located proximate edges of the protective cover a portable electronic device, and the attraction force may be the primary or only mechanism for securing the protective cover in place. Optionally, the attractive forces pass through the display surface without also passing through a side or peripheral surface of the portable electronic device.

12 Claims, 5 Drawing Sheets

Related U.S. Application Data continuation-in-part of application No. 12/832,845, filed on Jul. 8, 2010, now abandoned.

(60) Provisional application No. 61/661,283, filed on Jun. 18, 2012.

(51) Int. Cl.
*G06F 1/16* (2006.01)
*G06F 3/023* (2006.01)

(52) U.S. Cl.
CPC .......... *G06F 1/1679* (2013.01); *G06F 3/0231* (2013.01); *H05K 13/00* (2013.01); *G06F 2200/1633* (2013.01); *Y10T 29/49002* (2015.01)

(58) Field of Classification Search
CPC .... G06F 1/1613; G06F 1/1615; G06F 1/1616; G06F 1/1624; G06F 1/166; G06F 1/1626; G06F 1/1632; G06F 1/1679; G06F 1/1669; G06F 1/1667; G06F 2200/1633; G06F 3/0231; G06F 1/1637; G06F 1/162; G06F 3/0219; G06F 3/02; F16M 13/00; H05K 7/00; H05K 7/02; H05K 5/0086
USPC ............ 361/679.01, 679.02, 679.08, 679.09, 361/679.21, 679.26, 679.29, 679.3, 361/679.55, 679.56; 206/320, 45.24, 206/45.26, 701, 521, 736, 759, 765, 719; 248/157, 176.1, 176.3, 346.01, 346.03, 248/455, 456; 345/156, 168, 173, 169, 345/649; 312/208.4; 400/472–496
See application file for complete search history.

(56) References Cited

U.S. PATENT DOCUMENTS

| | | | |
|---|---|---|---|
| 358,583 A | 3/1887 | Timms |
| D23,076 S | 2/1894 | Samuels |
| 649,293 A | 5/1900 | French |
| X756486 | 4/1904 | Fleming |
| 805,895 A | 11/1905 | Wedderburn |
| D44,999 S | 12/1913 | Fraser |
| 1,169,869 A | 2/1916 | Richards |
| 1,203,659 A | 11/1916 | Smith |
| 1,308,010 A | 6/1919 | Gibson |
| 1,475,134 A | 11/1923 | Oakes |
| 1,499,113 A | 6/1924 | McNally |
| 1,588,618 A | 6/1926 | Rosen |
| 1,704,561 A | 3/1929 | Egan |
| 1,957,153 A | 5/1934 | Smiley |
| 2,165,255 A | 7/1939 | Hamilton |
| D125,415 S | 2/1941 | Freligh |
| 2,252,571 A | 8/1941 | Kohn |
| D130,450 S | 11/1941 | Brown |
| D139,823 S | 12/1944 | Jones |
| 2,373,617 A | 4/1945 | Tiryakian |
| 2,401,811 A | 6/1946 | Atticks |
| D163,463 S | 5/1951 | Lewis |
| 2,627,343 A | 2/1953 | Gallagher |
| D173,318 S | 10/1954 | Levenhagen |
| D173,319 S | 10/1954 | Levenhagen |
| 2,726,835 A | 12/1955 | Hummel |
| D178,990 S | 10/1956 | Erickson |
| 2,841,903 A | 7/1958 | Christensen |
| 2,916,236 A | 12/1959 | Cross et al. |
| 2,920,409 A | 1/1960 | Sampson |
| 2,946,545 A | 7/1960 | Sampson |
| D193,487 S | 8/1962 | Levenhagen |
| 3,125,356 A | 3/1964 | Cline |
| D201,732 S | 7/1965 | Bunn et al. |
| 3,195,850 A | 7/1965 | Steiner |
| 3,275,281 A | 9/1966 | Sampson |
| D208,331 S | 8/1967 | Gehl et al. |
| 3,367,679 A | 2/1968 | Slanhoff |
| 3,463,378 A | 8/1969 | Daalen Van |
| D218,352 S | 8/1970 | Hoch |
| 3,544,134 A | 12/1970 | Sibley |
| D221,349 S | 8/1971 | Bridges et al. |
| D224,366 S | 7/1972 | Rehrig |
| D224,735 S | 9/1972 | Reifers |
| D224,751 S | 9/1972 | Propst et al. |
| D226,284 S | 2/1973 | Bateman |
| D226,285 S | 2/1973 | Bateman |
| 3,758,065 A | 9/1973 | Ranseen |
| D229,894 S | 1/1974 | Reifers |
| 3,785,605 A | 1/1974 | Parekh |
| 3,800,022 A | 3/1974 | Buteux |
| D243,378 S | 2/1977 | Tharp |
| D243,977 S | 4/1977 | Roberts |
| 4,044,980 A | 8/1977 | Cummins |
| D247,025 S | 1/1978 | Cherry |
| 4,093,759 A | 6/1978 | Otsuki et al. |
| 4,111,305 A | 9/1978 | Thomas |
| D250,443 S | 12/1978 | Romanoff |
| 4,259,568 A | 3/1981 | Dynesen |
| D260,568 S | 9/1981 | Cherry |
| D261,904 S | 11/1981 | Polhemus |
| D264,032 S | 4/1982 | Rule |
| 4,353,470 A | 10/1982 | Polhemus et al. |
| D269,218 S | 5/1983 | Berman |
| D272,637 S | 2/1984 | Barbieri et al. |
| D272,726 S | 2/1984 | Kaneko |
| D274,441 S | 6/1984 | Stevenson |
| 4,460,146 A | 7/1984 | Raggiotti |
| D277,295 S | 1/1985 | Jones |
| D278,990 S | 5/1985 | Kaneko |
| D279,085 S | 6/1985 | Kaneko |
| D279,185 S | 6/1985 | Felix et al. |
| 4,555,084 A | 11/1985 | Anderson et al. |
| 4,555,128 A | 11/1985 | White |
| D282,042 S | 1/1986 | Gallagher |
| D282,043 S | 1/1986 | Morin |
| D282,335 S | 1/1986 | Dodd et al. |
| 4,574,944 A | 3/1986 | Gregory |
| 4,575,037 A | 3/1986 | Hammer |
| 4,576,115 A | 3/1986 | Gordon |
| D283,993 S | 5/1986 | Kaneko |
| D284,611 S | 7/1986 | Cotney et al. |
| D284,953 S | 8/1986 | Kaneko |
| 4,607,817 A | 8/1986 | Aquino |
| D286,352 S | 10/1986 | Huculak |
| 4,657,148 A | 4/1987 | Heng |
| D291,204 S | 8/1987 | Hampshire et al. |
| D292,357 S | 10/1987 | Narain |
| 4,709,895 A | 12/1987 | Mardak |
| 4,722,504 A | 2/1988 | Degenholtz |
| D294,957 S | 3/1988 | Lothe |
| D297,073 S | 8/1988 | Curci |
| 4,771,976 A | 9/1988 | Su |
| D298,489 S | 11/1988 | Sornborger |
| D298,968 S | 12/1988 | McAllister |
| D300,785 S | 4/1989 | Sorge et al. |
| 4,834,242 A | 5/1989 | Selack et al. |
| D305,015 S | 12/1989 | Roche |
| D305,035 S | 12/1989 | Yon et al. |
| 4,886,231 A | 12/1989 | Doerksen |
| 4,887,724 A | 12/1989 | Pielechowski et al. |
| 4,907,703 A | 3/1990 | Alger et al. |
| D307,500 S | 4/1990 | Mullaly |
| D307,967 S | 5/1990 | Lanius |
| D308,274 S | 5/1990 | Gosselin et al. |
| D308,497 S | 6/1990 | Roche |
| D309,059 S | 7/1990 | Bledsoe |
| D309,971 S | 8/1990 | Quong |
| D310,896 S | 9/1990 | Winjum |
| D313,493 S | 1/1991 | Apps et al. |
| 4,991,812 A | 2/1991 | Macewan |
| D317,467 S | 6/1991 | Kheng |
| 5,027,961 A | 7/1991 | Howitt |
| D319,472 S | 8/1991 | Clyburn |
| D322,245 S | 12/1991 | Lin |

(56) References Cited

U.S. PATENT DOCUMENTS

| | | |
|---|---|---|
| D323,616 S | 2/1992 | Mueller |
| 5,105,338 A | 4/1992 | Held |
| 5,109,985 A | 5/1992 | Rose |
| D327,200 S | 6/1992 | Szablak et al. |
| D327,503 S | 6/1992 | Szablak et al. |
| D327,504 S | 6/1992 | Breen et al. |
| D328,302 S | 7/1992 | Murzanski et al. |
| D328,314 S | 7/1992 | Macewan |
| 5,128,662 A | 7/1992 | Failla |
| 5,132,588 A | 7/1992 | Warman |
| D328,985 S | 9/1992 | Sheldon |
| D330,729 S | 11/1992 | Cornell |
| 5,164,542 A * | 11/1992 | Hart ............... G06F 1/1626 174/383 |
| D333,574 S | 3/1993 | Ackeret |
| 5,213,302 A | 5/1993 | Rowe, Jr. |
| 5,253,139 A | 10/1993 | Satou |
| 5,263,668 A | 11/1993 | Reiter |
| D342,364 S | 12/1993 | Hobson |
| D344,197 S | 2/1994 | Numbers |
| D348,284 S | 6/1994 | Thorud et al. |
| 5,319,582 A | 6/1994 | Ma |
| 5,329,427 A * | 7/1994 | Hogdahl ............... G06F 1/16 361/728 |
| 5,335,675 A | 8/1994 | Wheeler et al. |
| 5,337,985 A | 8/1994 | Hale |
| 5,408,774 A * | 4/1995 | Grewe ............... G09F 15/00 248/349.1 |
| D358,583 S | 5/1995 | Winkler |
| 5,415,293 A | 5/1995 | Ackermann et al. |
| 5,458,242 A | 10/1995 | Baka et al. |
| 5,485,980 A | 1/1996 | Luccia |
| 5,530,234 A | 6/1996 | Loh et al. |
| D372,896 S | 8/1996 | Nagele et al. |
| D376,787 S | 12/1996 | Calfee |
| D377,294 S | 1/1997 | Brady |
| 5,620,163 A | 4/1997 | Wu |
| 5,639,004 A | 6/1997 | Carlton et al. |
| 5,645,165 A | 7/1997 | Taniyama |
| D382,300 S | 8/1997 | Thorne et al. |
| 5,677,050 A | 10/1997 | Bilkadi et al. |
| 5,685,441 A | 11/1997 | Calfee |
| D388,263 S | 12/1997 | Amerault |
| 5,708,560 A | 1/1998 | Kumar et al. |
| 5,730,644 A | 3/1998 | Pfanstiehl |
| D395,640 S | 6/1998 | Goodman et al. |
| 5,820,957 A | 10/1998 | Shroeder et al. |
| 5,833,116 A | 11/1998 | Guillin |
| 5,871,189 A | 2/1999 | Hoftman |
| D411,767 S | 7/1999 | Keller |
| 5,927,673 A | 7/1999 | Kurokawa et al. |
| D412,786 S | 8/1999 | Killinger |
| D413,872 S | 9/1999 | Jessen |
| 6,003,831 A | 12/1999 | Coleman |
| 6,050,200 A | 4/2000 | Sullins et al. |
| 6,082,535 A | 7/2000 | Mitchell |
| 6,082,696 A | 7/2000 | Patterson |
| 6,094,341 A | 7/2000 | Lin |
| 6,108,200 A * | 8/2000 | Fullerton ............... G06F 1/1632 235/145 R |
| 6,113,052 A | 9/2000 | Gentile et al. |
| 6,129,323 A | 10/2000 | Mandokoro et al. |
| 6,142,868 A | 11/2000 | Pfanstiehl |
| 6,151,486 A | 11/2000 | Holshouser et al. |
| 6,154,359 A | 11/2000 | Kamikakai et al. |
| 6,164,451 A | 12/2000 | Sherman |
| D437,709 S | 2/2001 | Edstrom |
| 6,186,343 B1 | 2/2001 | Brown |
| D440,117 S | 4/2001 | Claffy et al. |
| 6,219,681 B1 | 4/2001 | Hawkins et al. |
| 6,231,023 B1 | 5/2001 | Morton |
| D443,999 S | 6/2001 | Cable |
| 6,249,431 B1 | 6/2001 | Chan |
| 6,250,765 B1 | 6/2001 | Murakami |
| 6,256,193 B1 | 7/2001 | Janik et al. |
| 6,259,597 B1 | 7/2001 | Anzai et al. |
| 6,270,049 B1 | 8/2001 | Olvey |
| 6,282,082 B1 | 8/2001 | Armitage et al. |
| 6,282,085 B1 | 8/2001 | Chao et al. |
| 6,293,591 B1 | 9/2001 | Pecci |
| 6,297,981 B1 | 10/2001 | Berberich et al. |
| 6,307,741 B1 | 10/2001 | Karidis et al. |
| D454,533 S | 3/2002 | Benson |
| D456,454 S | 4/2002 | Bond et al. |
| 6,372,313 B1 | 4/2002 | D'Alessio et al. |
| 6,408,132 B1 | 6/2002 | Ishikawa |
| 6,480,373 B1 | 11/2002 | Landry et al. |
| 6,487,068 B1 | 11/2002 | Rahemtulla |
| 6,492,974 B1 | 12/2002 | Nobuchi et al. |
| 6,558,057 B2 * | 5/2003 | Lin ............... G06F 3/0202 312/208.3 |
| 6,568,543 B1 | 5/2003 | Schneider |
| D477,365 S | 7/2003 | Chen |
| 6,596,400 B1 | 7/2003 | Friedman et al. |
| D479,062 S | 9/2003 | Meyer |
| 6,613,411 B2 | 9/2003 | Kollaja et al. |
| 6,614,423 B1 | 9/2003 | Wong et al. |
| 6,614,722 B2 | 9/2003 | Polany et al. |
| 6,620,281 B1 | 9/2003 | Sommers |
| D483,071 S | 12/2003 | Chen |
| 6,697,045 B2 | 2/2004 | Min |
| 6,697,262 B2 | 2/2004 | Adams et al. |
| 6,700,775 B1 | 3/2004 | Chuang et al. |
| 6,710,576 B1 | 3/2004 | Kaufman et al. |
| 6,735,698 B1 | 5/2004 | Callam |
| 6,752,430 B2 | 6/2004 | Holt et al. |
| 6,772,879 B1 | 8/2004 | Domotor |
| 6,778,196 B2 | 8/2004 | Nakamura |
| 6,798,649 B1 | 9/2004 | Olodort et al. |
| 6,802,416 B1 | 10/2004 | D'Alessio et al. |
| 6,803,904 B2 * | 10/2004 | Furuki ............... G06F 1/1632 345/156 |
| 6,829,140 B2 | 12/2004 | Shimano et al. |
| 6,831,714 B2 | 12/2004 | Masaki et al. |
| 6,841,190 B2 | 1/2005 | Liu et al. |
| D501,666 S | 2/2005 | Chan |
| D502,742 S | 3/2005 | Bain |
| 6,869,299 B2 | 3/2005 | Tanaka et al. |
| 6,870,732 B2 * | 3/2005 | Huang et al. ............ 361/679.17 |
| 6,878,425 B1 | 4/2005 | Gomes |
| 6,882,524 B2 | 4/2005 | Ulla et al. |
| D510,517 S | 10/2005 | Noack |
| 6,960,040 B2 | 11/2005 | D'Alessio et al. |
| D513,008 S | 12/2005 | Takizawa et al. |
| 6,971,622 B2 | 12/2005 | Ziegler et al. |
| 6,975,507 B2 | 12/2005 | Wang et al. |
| 6,975,888 B2 | 12/2005 | Buesseler et al. |
| 6,986,492 B2 * | 1/2006 | Huang ............... G06F 1/1632 248/346.03 |
| 6,999,008 B2 * | 2/2006 | Wang ............... G06F 1/1632 341/22 |
| D517,328 S | 3/2006 | Thrall |
| 7,011,215 B2 | 3/2006 | Meissen et al. |
| D519,121 S | 4/2006 | Zamanian |
| D519,172 S | 4/2006 | Penat et al. |
| 7,025,274 B2 | 4/2006 | Solomon et al. |
| 7,042,713 B2 | 5/2006 | Nicolosi |
| D524,319 S | 7/2006 | Zamanian |
| 7,085,129 B2 * | 8/2006 | Hsu ............... G06F 1/1632 248/918 |
| 7,090,074 B2 | 8/2006 | Isaacs |
| 7,099,149 B2 | 8/2006 | Krieger et al. |
| 7,104,516 B2 | 9/2006 | Uto et al. |
| 7,123,471 B2 | 10/2006 | Wang et al. |
| D534,730 S | 1/2007 | Hardy |
| D537,633 S | 3/2007 | Marnell, II |
| D538,041 S | 3/2007 | Reitze |
| 7,196,692 B2 * | 3/2007 | Mochizuki ............ G06F 1/1601 345/168 |
| D540,859 S | 4/2007 | Weiler |
| 7,208,833 B2 | 4/2007 | Norbori et al. |
| D542,841 S | 5/2007 | King et al. |
| 7,236,355 B2 | 6/2007 | Ulla et al. |
| 7,287,751 B2 | 10/2007 | Webber, Jr. |

(56) References Cited

U.S. PATENT DOCUMENTS

| | | |
|---|---|---|
| D555,163 S | 11/2007 | Beilstein et al. |
| D557,259 S | 12/2007 | Hirsch |
| D557,267 S | 12/2007 | Beilstein et al. |
| D557,495 S | 12/2007 | Chan et al. |
| D557,698 S | 12/2007 | Lye |
| 7,318,521 B2 | 1/2008 | Min et al. |
| D562,589 S | 2/2008 | Mellon et al. |
| D562,637 S | 2/2008 | Gruneisen, III |
| D563,093 S | 3/2008 | Nussberger |
| D563,176 S | 3/2008 | Gruneisen, III |
| D566,191 S | 4/2008 | Boyette |
| D566,192 S | 4/2008 | Bhavnani |
| D567,630 S | 4/2008 | Brassard |
| D567,631 S | 4/2008 | Brassard |
| D569,380 S | 5/2008 | Beilstein et al. |
| 7,389,869 B2 | 6/2008 | Mason, Jr. |
| D573,654 S | 7/2008 | Hardy et al. |
| D574,151 S | 8/2008 | Reitze |
| D574,819 S | 8/2008 | Andre et al. |
| D577,904 S | 10/2008 | Sasaki |
| D584,304 S | 1/2009 | Lin |
| 7,479,902 B2 * | 1/2009 | Wang .............. G06F 1/1632 341/22 |
| D585,647 S | 2/2009 | Whiteside et al. |
| 7,486,503 B1 | 2/2009 | Wang et al. |
| 7,489,525 B2 | 2/2009 | Cheng et al. |
| 7,495,895 B2 | 2/2009 | Carnevali |
| 7,503,538 B2 | 3/2009 | Liou et al. |
| D592,188 S | 5/2009 | Huang |
| 7,527,235 B2 | 5/2009 | Hummel |
| 7,529,364 B2 | 5/2009 | Buehler |
| 7,537,192 B2 | 5/2009 | Al-Haleem et al. |
| 7,540,466 B2 | 6/2009 | Yang |
| 7,541,907 B2 * | 6/2009 | Wang et al. .............. 335/305 |
| D596,902 S | 7/2009 | Hrovat |
| 7,558,594 B2 | 7/2009 | Wilson |
| D598,197 S | 8/2009 | Ahlstrom |
| 7,578,243 B2 | 8/2009 | Gevaert |
| D600,748 S | 9/2009 | Tabuchi et al. |
| 7,584,841 B2 | 9/2009 | Chan et al. |
| D601,654 S | 10/2009 | Sykes |
| D602,913 S | 10/2009 | Han et al. |
| 7,609,524 B2 | 10/2009 | Ting et al. |
| D604,615 S | 11/2009 | Doster |
| 7,620,176 B2 * | 11/2009 | Gullickson .......... G06F 1/1632 379/446 |
| 7,630,745 B2 | 12/2009 | Chen et al. |
| 7,652,452 B2 | 1/2010 | Mori et al. |
| D609,226 S | 2/2010 | Hofer et al. |
| 7,656,652 B2 | 2/2010 | Moser |
| D611,544 S | 3/2010 | Liptan |
| D615,079 S | 5/2010 | Masuyama et al. |
| D616,433 S | 5/2010 | Morishita et al. |
| 7,719,830 B2 * | 5/2010 | Howarth .............. G06F 1/1632 312/223.2 |
| D616,700 S | 6/2010 | Pourounidis et al. |
| 7,735,644 B2 | 6/2010 | Sirichai et al. |
| D619,089 S | 7/2010 | Chen |
| D619,257 S | 7/2010 | Meschenmoser et al. |
| D619,361 S | 7/2010 | Andre et al. |
| D619,822 S | 7/2010 | Damgaard-Sørensen |
| D621,839 S | 8/2010 | Sweet |
| 7,775,356 B2 | 8/2010 | Palmer |
| 7,781,610 B2 | 8/2010 | Schneider et al. |
| D623,180 S | 9/2010 | Diebel |
| D623,874 S | 9/2010 | Jones |
| D624,304 S | 9/2010 | Danze et al. |
| D624,532 S | 9/2010 | Huskinson |
| D624,908 S | 10/2010 | Huskinson |
| D625,524 S | 10/2010 | Schwartz et al. |
| D626,129 S | 10/2010 | Lutz |
| D628,185 S | 11/2010 | Ng |
| 7,828,260 B2 | 11/2010 | Hauser et al. |
| 7,845,612 B2 | 12/2010 | Mase |
| 7,861,995 B2 | 1/2011 | Liou |
| D631,937 S | 2/2011 | Sykes |
| D633,728 S | 3/2011 | Fabricatore |
| D635,191 S | 3/2011 | Cheetwood |
| 7,907,400 B2 | 3/2011 | Bekele |
| 7,924,554 B2 * | 4/2011 | Shen ................. 361/679.21 |
| D637,451 S | 5/2011 | Cheng |
| D637,583 S | 5/2011 | Beal et al. |
| D637,592 S | 5/2011 | Magness et al. |
| D639,286 S | 6/2011 | Mohoney |
| D639,296 S | 6/2011 | Tseng et al. |
| D639,816 S | 6/2011 | Bau |
| D640,708 S | 6/2011 | Lee |
| 7,957,524 B2 | 6/2011 | Chipping |
| 7,969,732 B1 * | 6/2011 | Noble ................. F16M 13/00 361/679.56 |
| D641,177 S | 7/2011 | Chamberlain |
| 8,004,834 B2 | 8/2011 | Shih et al. |
| 8,009,143 B2 | 8/2011 | Huang |
| 8,023,256 B2 | 9/2011 | Walker et al. |
| D646,903 S | 10/2011 | Santana |
| D646,904 S | 10/2011 | Feldstein et al. |
| D647,519 S | 10/2011 | Rothbaum et al. |
| D648,529 S | 11/2011 | Brown |
| D648,707 S | 11/2011 | Akana et al. |
| D648,728 S | 11/2011 | Atkins et al. |
| 8,056,725 B2 | 11/2011 | Doster |
| D651,204 S | 12/2011 | Wibby et al. |
| D651,459 S | 1/2012 | Eades et al. |
| 8,100,376 B2 | 1/2012 | Ye |
| 8,126,519 B2 | 2/2012 | Matsuoka |
| D656,500 S | 3/2012 | Maruyama et al. |
| D659,139 S | 5/2012 | Gengler |
| D659,691 S | 5/2012 | Kim et al. |
| D660,809 S | 5/2012 | Kern Koskela et al. |
| 8,173,893 B2 | 5/2012 | Huang |
| D661,693 S | 6/2012 | Andre et al. |
| D662,923 S | 7/2012 | Piedra et al. |
| D662,928 S | 7/2012 | Fahrendorff et al. |
| D664,528 S | 7/2012 | Chen et al. |
| 8,233,109 B2 * | 7/2012 | Bergeron et al. .............. 349/58 |
| D665,210 S | 8/2012 | Hughes |
| D665,735 S | 8/2012 | Kang et al. |
| D665,810 S | 8/2012 | Jones et al. |
| D666,174 S | 8/2012 | Du et al. |
| D666,614 S | 9/2012 | Ding |
| 8,284,543 B2 | 10/2012 | Wang |
| 8,290,549 B2 | 10/2012 | Reeves et al. |
| 8,315,044 B2 | 11/2012 | Wu et al. |
| D672,352 S | 12/2012 | Gengler |
| 8,346,321 B2 | 1/2013 | Huang |
| 8,363,014 B2 * | 1/2013 | Leung et al. .................. 345/169 |
| 8,422,210 B2 | 4/2013 | Moser |
| 8,451,595 B2 | 5/2013 | Leung et al. |
| 8,467,183 B2 | 6/2013 | Probst et al. |
| 8,467,185 B2 | 6/2013 | Probst et al. |
| 8,490,846 B1 | 7/2013 | Wheatley et al. |
| 8,568,154 B2 * | 10/2013 | Chang ................. H01R 13/6315 439/173 |
| D696,262 S | 12/2013 | Groene et al. |
| 8,817,457 B1 * | 8/2014 | Colby ................. G06F 1/1669 361/679.29 |
| 9,218,024 B2 * | 12/2015 | Gengler ............... G06F 1/1637 |
| 10,013,074 B2 | 7/2018 | Gengler |
| 2001/0022719 A1 | 9/2001 | Armitage et al. |
| 2001/0040561 A1 * | 11/2001 | Weinzierl ............ G06F 1/1628 345/169 |
| 2002/0036228 A1 | 3/2002 | Reese et al. |
| 2002/0070883 A1 * | 6/2002 | Dosch .................. G06F 1/1626 341/22 |
| 2002/0088918 A1 | 7/2002 | Allen |
| 2002/0162935 A1 | 11/2002 | Hardy |
| 2002/0197069 A1 | 12/2002 | Tomizawa |
| 2003/0025674 A1 * | 2/2003 | Watanabe ............ G06F 1/1632 345/168 |
| 2003/0090865 A1 | 5/2003 | Silverstein |
| 2003/0112589 A1 | 6/2003 | Shimano et al. |
| 2003/0142474 A1 | 7/2003 | Karidis et al. |
| 2003/0217497 A1 | 11/2003 | Nagel |
| 2004/0007649 A1 | 1/2004 | Vettraino |

(56) References Cited

U.S. PATENT DOCUMENTS

| | | | |
|---|---|---|---|
| 2004/0075588 A1* | 4/2004 | Wang | G06F 1/1632 341/22 |
| 2004/0090742 A1 | 5/2004 | Son et al. | |
| 2004/0195305 A1* | 10/2004 | Dotson | G06F 1/1632 235/145 R |
| 2004/0246386 A1 | 12/2004 | Thomas et al. | |
| 2005/0022924 A1 | 2/2005 | Blackburn | |
| 2005/0025924 A1 | 2/2005 | Toyama | |
| 2005/0047589 A1 | 3/2005 | Chang | |
| 2005/0057516 A1 | 3/2005 | Ghosh et al. | |
| 2005/0111182 A1 | 5/2005 | Lin et al. | |
| 2005/0116334 A1 | 6/2005 | Buehler | |
| 2005/0122671 A1 | 6/2005 | Homer | |
| 2005/0200608 A1 | 9/2005 | Ulla et al. | |
| 2005/0205623 A1 | 9/2005 | Buntain | |
| 2005/0231930 A1 | 10/2005 | Jao | |
| 2005/0263666 A1 | 12/2005 | Kim | |
| 2005/0264988 A1 | 12/2005 | Nicolosi | |
| 2006/0007645 A1 | 1/2006 | Chen et al. | |
| 2006/0018089 A1* | 1/2006 | Chou | G06F 1/1626 361/679.09 |
| 2006/0037507 A1 | 2/2006 | Trigg et al. | |
| 2006/0040081 A1 | 2/2006 | Hodsdon et al. | |
| 2006/0044288 A1 | 3/2006 | Nakamura et al. | |
| 2006/0154029 A1 | 7/2006 | Antonini | |
| 2006/0177641 A1 | 8/2006 | Breese et al. | |
| 2006/0186001 A1 | 8/2006 | Anderson et al. | |
| 2006/0222801 A1 | 10/2006 | Mase | |
| 2006/0227111 A1 | 10/2006 | Chou | |
| 2006/0249646 A1 | 11/2006 | Al-Haleem | |
| 2006/0289445 A1 | 12/2006 | Colonna | |
| 2006/0292319 A1 | 12/2006 | Kurashina et al. | |
| 2007/0023559 A1 | 2/2007 | Scapillato et al. | |
| 2007/0026234 A1 | 2/2007 | Mase | |
| 2007/0057140 A1 | 3/2007 | Liou et al. | |
| 2007/0133156 A1 | 6/2007 | Ligtenberg et al. | |
| 2007/0165373 A1 | 7/2007 | Merz et al. | |
| 2007/0229962 A1 | 10/2007 | Mason, Jr. | |
| 2008/0037767 A1* | 2/2008 | Gullickson | G06F 1/1632 379/428.02 |
| 2008/0062625 A1 | 3/2008 | Batio | |
| 2008/0062652 A1 | 3/2008 | Liberman et al. | |
| 2008/0174942 A1 | 7/2008 | Yang et al. | |
| 2008/0180892 A1 | 7/2008 | Lai | |
| 2008/0289359 A1 | 11/2008 | Godowski et al. | |
| 2009/0009945 A1 | 1/2009 | Johnson et al. | |
| 2009/0040703 A1 | 2/2009 | Gotham et al. | |
| 2009/0050499 A1 | 2/2009 | Calco et al. | |
| 2009/0061956 A1 | 3/2009 | Matsuoka | |
| 2009/0073671 A1 | 3/2009 | Lin | |
| 2009/0086415 A1 | 4/2009 | Chipping | |
| 2009/0301907 A1 | 12/2009 | Mason | |
| 2009/0325657 A1 | 12/2009 | Ramsdell et al. | |
| 2010/0014235 A1* | 1/2010 | Huang | G06F 1/1613 361/679.09 |
| 2010/0028586 A1 | 2/2010 | Enlow et al. | |
| 2010/0072334 A1 | 3/2010 | Le Gette et al. | |
| 2010/0104814 A1* | 4/2010 | Richardson | H04B 1/3888 428/156 |
| 2010/0122924 A1 | 5/2010 | Andrews | |
| 2010/0123663 A1 | 5/2010 | Leung et al. | |
| 2010/0182761 A1 | 7/2010 | Suzuki et al. | |
| 2010/0195279 A1* | 8/2010 | Michael | G06F 1/1632 361/679.41 |
| 2010/0203931 A1 | 8/2010 | Hynecek et al. | |
| 2010/0238620 A1* | 9/2010 | Fish | 361/679.09 |
| 2010/0240427 A1 | 9/2010 | Lee | |
| 2010/0270189 A1 | 10/2010 | Pedersen, II et al. | |
| 2010/0277858 A1 | 11/2010 | Zhou | |
| 2010/0320349 A1* | 12/2010 | Necessary | F16M 11/10 248/346.03 |
| 2011/0024371 A1 | 2/2011 | Lampman et al. | |
| 2011/0031287 A1 | 2/2011 | Le Gette et al. | |
| 2011/0141677 A1 | 6/2011 | Cheng | |
| 2011/0167181 A1 | 7/2011 | Minoo et al. | |
| 2011/0168864 A1 | 7/2011 | Marchione | |
| 2011/0199727 A1 | 8/2011 | Probst | |
| 2011/0259788 A1 | 10/2011 | Zeliff et al. | |
| 2011/0260014 A1 | 10/2011 | Chen | |
| 2011/0267757 A1 | 11/2011 | Probst et al. | |
| 2011/0284420 A1 | 11/2011 | Sajid | |
| 2011/0292584 A1* | 12/2011 | Hung | G06F 1/1626 361/679.26 |
| 2011/0297566 A1 | 12/2011 | Gallagher et al. | |
| 2011/0317347 A1 | 12/2011 | Lin et al. | |
| 2012/0008269 A1 | 1/2012 | Gengler | |
| 2012/0008299 A1 | 1/2012 | Gengler | |
| 2012/0037047 A1 | 2/2012 | Moldovan | |
| 2012/0057288 A1 | 3/2012 | Chou et al. | |
| 2012/0066424 A1* | 3/2012 | Gentil | G06F 1/1616 710/303 |
| 2012/0074271 A1 | 3/2012 | Goetz | |
| 2012/0092195 A1* | 4/2012 | Lin | G06F 1/1626 341/22 |
| 2012/0099263 A1 | 4/2012 | Lin | |
| 2012/0170194 A1 | 7/2012 | Lord et al. | |
| 2012/0170212 A1 | 7/2012 | Gallouzi et al. | |
| 2012/0199501 A1 | 8/2012 | Le Gette et al. | |
| 2012/0211377 A1 | 8/2012 | Sajid | |
| 2012/0243149 A1* | 9/2012 | Gartrell | G06F 1/1616 361/679.01 |
| 2012/0287562 A1* | 11/2012 | Wu | G06F 1/1626 361/679.01 |
| 2012/0293953 A1 | 11/2012 | Wu et al. | |
| 2012/0327580 A1 | 12/2012 | Gengler | |
| 2012/0327594 A1* | 12/2012 | Gengler | G06F 1/1637 361/679.56 |
| 2013/0106815 A1 | 5/2013 | Virolainen et al. | |
| 2013/0114198 A1 | 5/2013 | Gengler | |
| 2013/0147716 A1* | 6/2013 | Hawker | G06F 1/1632 345/168 |
| 2013/0170126 A1 | 7/2013 | Lee | |
| 2013/0258586 A1 | 10/2013 | Shao et al. | |
| 2013/0279096 A1 | 10/2013 | Gengler | |

FOREIGN PATENT DOCUMENTS

| | | |
|---|---|---|
| KR | 200206982 Y1 | 12/2000 |
| WO | 2003036454 A1 | 5/2003 |
| WO | 2007046637 A1 | 4/2007 |

OTHER PUBLICATIONS

United States Patent and Trademark Office as the International Searching Authority, "International Search Report and Written Opinion," dated Nov. 16, 2011 in related International Patent Application No. PCT/US2011/043450.

European Patent Office, "Supplementary European Search Report," completed Apr. 12, 2013, in related European application No. EP 11 73 3987.

Osborn, K.R., et al. "Plastic Films"; Technology and Packaging Application (1990).

State Intellectual Property Office, "Notification of First Office Action", Chinese Application No. 201180001096.8, dated May 6, 2014.

Tocken Wrapper, "Protective film for ipod shuffle," www.tocken.co.kr, 2004-2005.

http://www.enfun.net/technique/review/?step=20&dataSeqNo=42417, Jan. 13, 2005.

Crandall et al., "An Introduction to the Mechanics of Solids," pp. 273-276, Jan. 25, 1996.

Tocken Wrapper, "Tocken Wrapper for iPod mini," http://caizer.com/mid=tech&page=22&document_srl=20234&listStyle=&page=, Feb. 18, 2005.

Statement by Min-Woo SEO of Samsung Electronics Co., Ltd., Mar. 10, 2010.

Kim & Chang, "Presentation for Oral Hearing for Invalidation and Scope Confirmation Trial of Registered Patent No. 784501," Case No. 2008 Dang 3751 and 2009 Dang 1523, Mar. 16, 2010.

(56) References Cited

OTHER PUBLICATIONS

Tocken Wrapper, "User's Review: Withipod Community for Korean Ipod Users," http://www.withipod.net/bbs/zboard/php?id=community_ipod_gallery&no=1188; Mar. 21, 2005.

Tocken Wrapper, "User's Review: Withipod Community for Korean Ipod Users," http://www.withipod.net/bbs/zboard/php?id=community_ipod_gallery&no=1224; Mar. 24, 2005.

"Auto Paint Guard Automobile Clear Bra—Protecting Your Investment," http://web.archive.org/web/20050728232723/http://www.autopaintguard.com/installation.html, Jul. 2005.

Appleforum, http://www.appleforum.com, Jul.-Nov. 2005.

"I hate the Same thing though it is pretty!:Tocken Wrapper," MacMadang, vol. 162, Jul. 1, 2005.

"User's review of Noxk PSP protection film," http://raven.egloos.com/1076693, Jul. 25, 2005.

Tocken Wrapper, "Tocken Wrapper sales bulletin," http://kmug.co.kr, Sep. 11, 2005.

Kim & Chang, Seung-Kyun Oh (president of Korean distributor for ZAGG), "Brief for Invalidation and Scope Confirmation Trial of Registered Patent No. 784501," Case No. 2008 Dang 3751 and 2009 Dang 1523, Sep. 18, 2009; English translation only.

3M, "Polyurethane Protective Tape: Preparation and Application Instructions," Technical Bulletin, Oct. 2001.

Kim & Chang, Seung-Kyun Oh (president of Korean distributor for ZAGG), "Brief for Invalidation and Scope Confirmation Trial of Registered Patent No. 784501," Case No. 2008 Dang 3751 and 2009 Dang 1523, Oct. 14, 2009.

Kim & Chang, "SGP Brief for Invalidation and Scope Confirmation Trial of Registered Patent No. 784501," Case No. 2008 Dang 3751 and 2009 Dang 1523, Oct. 14, 2009.

Kim & Chang, Seung-Kyun Oh (president of Korean distributor for ZAGG), "Brief for Invalidation and Scope Confirmation Trial of Registered Patent No. 784501," Case No. 2008 Dang 3751 and 2009 Dang 1523, Nov. 14, 2009.

"With iPod Community for Korean ipod Users," http://withipod.neU?mid=podmagazine notice&category=2078464&search keyword=tocken&search target=title&document_sri=2078532, Nov. 22, 2004.

USPTO as the International Searching Authority, "International Search Report and Written Opinion," International Application No. PCT/US2012/044016, dated Sep. 14, 2012.

* cited by examiner

PROTECTIVE COVER FOR PORTABLE ELECTRONIC DEVICE AND ASSOCIATED SYSTEMS AND METHODS

CROSS-REFERENCE TO RELATED APPLICATIONS

A claim to the benefit of the Jun. 18, 2013 filing date of U.S. Provisional Patent Application 61/661,283, titled PROTECTIVE COVER FOR PORTABLE ELECTRONIC DEVICE, AND ACCESSORIES, SUPPORT DEVICES AND METHODS ASSOCIATED THEREWITH ("the '283 Provisional Application"), is hereby made pursuant to 35 U.S.C. § 119(e). This application is also a continuation-in-part of U.S. patent application Ser. No. 12/954,841, titled PROTECTIVE COVER FOR A MOBILE COMPUTING DEVICE, SYSTEMS INCLUDING PROTECTIVE COVERS, AND ASSOCIATED METHODS, filed on Nov. 26, 2010 ("the '841 Application"), which is a continuation-in-part of U.S. patent application Ser. No. 12/832,845, filed on Jul. 8, 2012 and titled SYSTEM AND APPARATUS FOR PROTECTING A MOBILE DEVICE ("the '845 Application"). The disclosures of the '283 Provisional Application, the '841 Application, and the '845 Application are hereby incorporated herein, in their entireties.

TECHNICAL FIELD

This disclosure relates generally to devices for protecting portable electronic devices, or protective covers. More particularly, this disclosure relates to protective covers that are integrated with peripheral accessories, such as keyboards. The disclosure also relates to protective covers that are configured to support portable electronic devices during use. In addition, systems and methods for protecting, supporting, and using portable electronic devices are also disclosed.

RELATED ART

Since the advent of mobile computing, portable electronic devices have become increasingly portable, easier to use, and more affordable. As a result, the frequency with which portable electronic devices are used, and the circumstances and locations where used, have also experienced significant increases. In fact, users who carry portable electronic devices often access them many times throughout a day, in multiple locations and frequently use more than one portable electronic device.

The portability of portable electronic devices has largely been made possible by advances in technology that enable processors, storage and memory devices, network communication devices, and other computing elements and systems to be ever more powerful (e.g., faster, greater capacity, etc.) without corresponding increases in size. Consequently, portable electronic devices are becoming increasingly more powerful and convenient.

The display elements of many state-of-the-art portable electronic devices include comprise touch-sensitive displays that have input capabilities. The use of touch sensitive displays and other interactive display elements eliminates the need for many mechanical input devices (e.g., keys, buttons, switches, etc.). Nevertheless, interactive display elements are typically sensitive (i.e., more prone to damage than their mechanical counterparts, etc.) and expensive to replace. In addition, since touch-sensitive displays are interactive, they are typically readily accessible and, thus, exposed.

SUMMARY

A protective cover for a portable electronic device, such as a tablet computer, a smart phone or the like, is configured to be positioned and secured in place over a display surface of the portable electronic device. Systems in which such a protective cover is used are also disclosed, as are methods in which such a protective cover may be used.

In various embodiments, a protective cover according to this disclosure may include a housing that may be sized (i.e., have dimensions) and configured to be positioned over a display surface of a particular type of portable electronic device. In some embodiments, the housing of the protective cover may be configured complementarily to the display surface, and/or to a housing of the portable electronic device. The housing and the protective cover include an interior surface that is configured to face and to be positioned against the display surface of the portable electronic device.

In some embodiments, the housing of the protective cover may carry a peripheral device (e.g., a keyboard, etc.) configured for use with the portable electronic device. The peripheral device may be accessible from, and face in the same direction as, or outward from, an interior surface of the housing or the protective cover. An outer surface of the peripheral device, which faces in the same direction as the interior surface of the housing and protective cover, may be coplanar with the interior surface, or recessed beneath the interior surface.

Attachment elements of the protective cover may be configured to mutually engage corresponding attachment elements of a complementary portable electronic device. Such mutual engagement may occur through the display surface. Without limitation, the mutual engagement may comprise magnetic attraction between the attachment elements of the protective cover and corresponding attachment elements of the portable electronic device.

A protective cover may be configured for positioning over a display surface of a portable electronic device without engaging a peripheral edge of the portable electronic device. In some embodiments, the protective cover may be configured to be positioned over the display surface without substantially extending over or covering any peripheral edge of the portable electronic device; i.e., an alignment feature may extend slightly over some or all of one or more peripheral edges of the portable electronic device to facilitate alignment of the protective cover over the display surface of the portable electronic device, but a majority of the thickness of the peripheral edge may remain exposed when the protective cover is assembled over the display surface of the portable electronic device.

Portable electronic device systems include a portable electronic device and a protective cover configured for use therewith. The portable electronic device of such a system may comprise tablet computer, a smart phone or the like. The protective cover may include any of the features disclosed above, or any combination of the disclosed features.

Methods for protecting, supporting, and using electronic devices may include use of a protective cover that incorporates teachings of this disclosure. When used to protect an electronic device, an interior surface of a protective cover may be positioned over the electronic device and aligned therewith. In some embodiments, features of the protective cover may mechanically engage corresponding features of the portable electronic device to properly align the protective cover with the portable electronic device. Upon positioning and aligning the protective cover with its interior surface over the display surface of a portable electronic device, and the protective cover and portable electronic device have been assembled with one another, complementary attachment features of the protective cover and the portable electronic device may secure the protective cover in place over the display surface of the portable electronic device. In some embodiments, the complementary attachment features may function through the display surface of the portable electronic device (e.g., when the attachment elements comprise magnets, etc.).

The protective cover may be readily removed from the display surface of the portable electronic device by pulling the protective cover away from the display surface. With the protective cover and the portable electronic device disassembled, the protective cover may be used to support the portable electronic device in an at least partially upright, or "working," orientation (e.g., perpendicularly, at an inclined angle, etc.). More specifically, a peripheral edge of the portable electronic device may be engaged by a support element at the interior surface of the protective cover (e.g., the peripheral edge may be inserted into a slot formed in the interior surface of the protective cover, etc.). The support element and a configuration of the protective cover (e.g., its dimensions, shape, weight, weight distribution, etc.) may hold the portable electronic device in the at least partially upright orientation.

With the portable electronic device in the at least partially upright orientation, any peripheral device of the protective cover (e.g., a keyboard, etc.) may be used to enhance the functionality of the portable electronic device.

Other aspects, as well as the features and advantages of various aspects, of the disclosed subject matter will become apparent to those of ordinary skill in the art through consideration of the ensuing description, the accompanying drawings, and the appended claims.

BRIEF DESCRIPTION OF THE DRAWINGS

Various embodiments of the disclosed subject matter are illustrated by the appended drawings, in which.

DETAILED DESCRIPTION

Examples of portable electronic devices with which a protective cover that incorporates teachings of this disclosure may be used include, but are not limited to, so called "slate" or "tablet" computers, smart phones, hand-held multimedia devices (or "digital media players"), e readers or the like. A few examples of "slate" or "tablet" computers include, but are not limited to, the IPAD® products available from Apple, Inc., the XOOM™ tablet computer available from Motorola Mobility, Inc., the BLACKBERRY PLAYBOOK™ available from Research in Motion Limited, the STREAK™ available from Dell Inc., the HP TOUCHPAD™ available from Hewlett-Packard Co., and the GALAXY TAB™ available from Samsung Electronics Co., Ltd. The KINDLE® devices available from Amazon Technologies, Inc. and the NOOK™ devices available from Barnes & Noble, Inc., are examples of e readers. Examples of smart phones may include, but are certainly not limited to, the IPHONE® devices available from Apple, Inc. and the GALAXY™ devices available from Samsung Electronics Co., Ltd. Some non limiting examples of multimedia devices include the IPOD® and IPOD TOUCH® devices available from Apple, Inc. and any number of additional devices from various manufacturers and having different capabilities. Of course a protective cover may be configured for use with other types of electronic devices as well.

Figure 1:
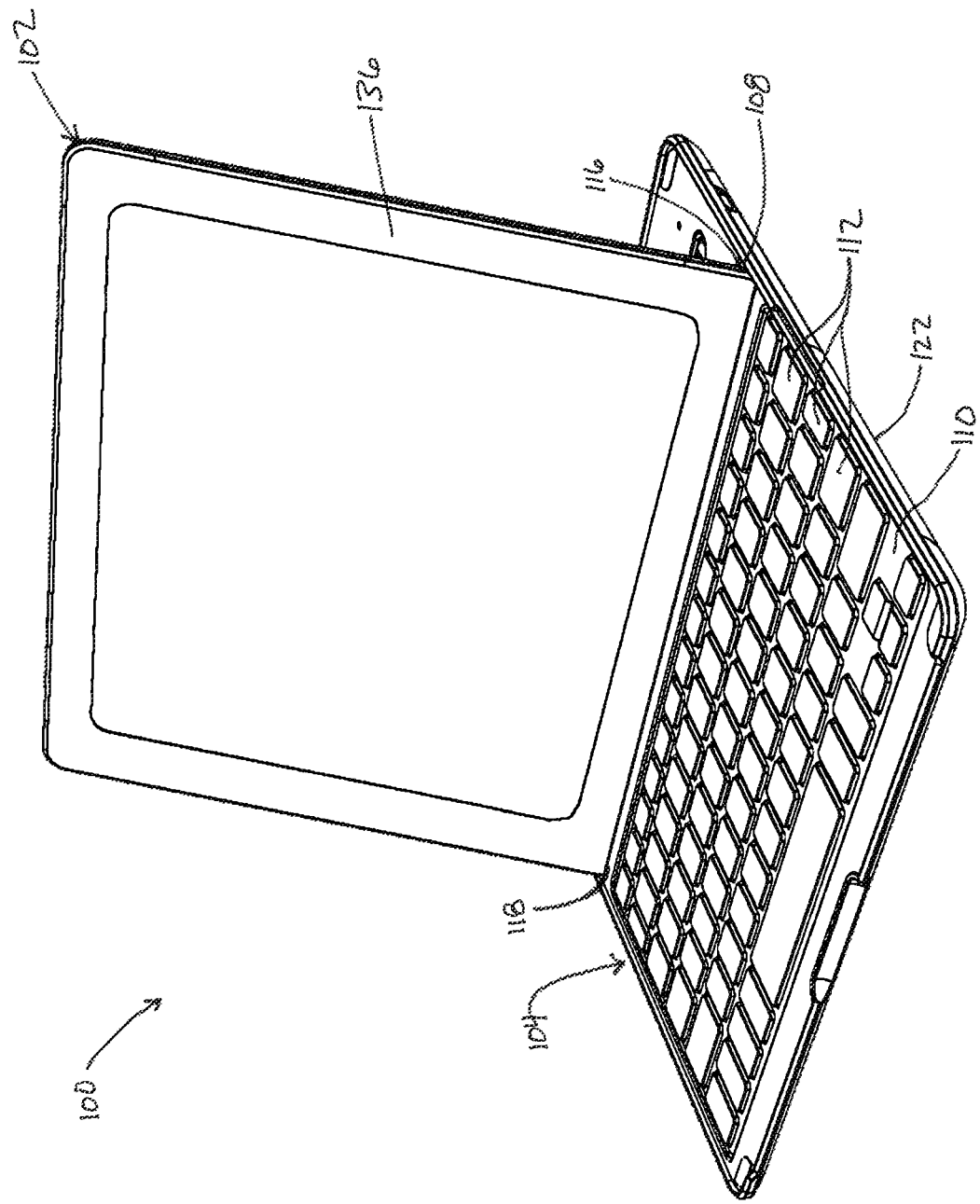
FIG. 1 is a perspective view of an embodiment of a protective cover, in which the protective cover is configured to support, and supports, a portable electronic device in an at least partially upright orientation.
Figure 2:
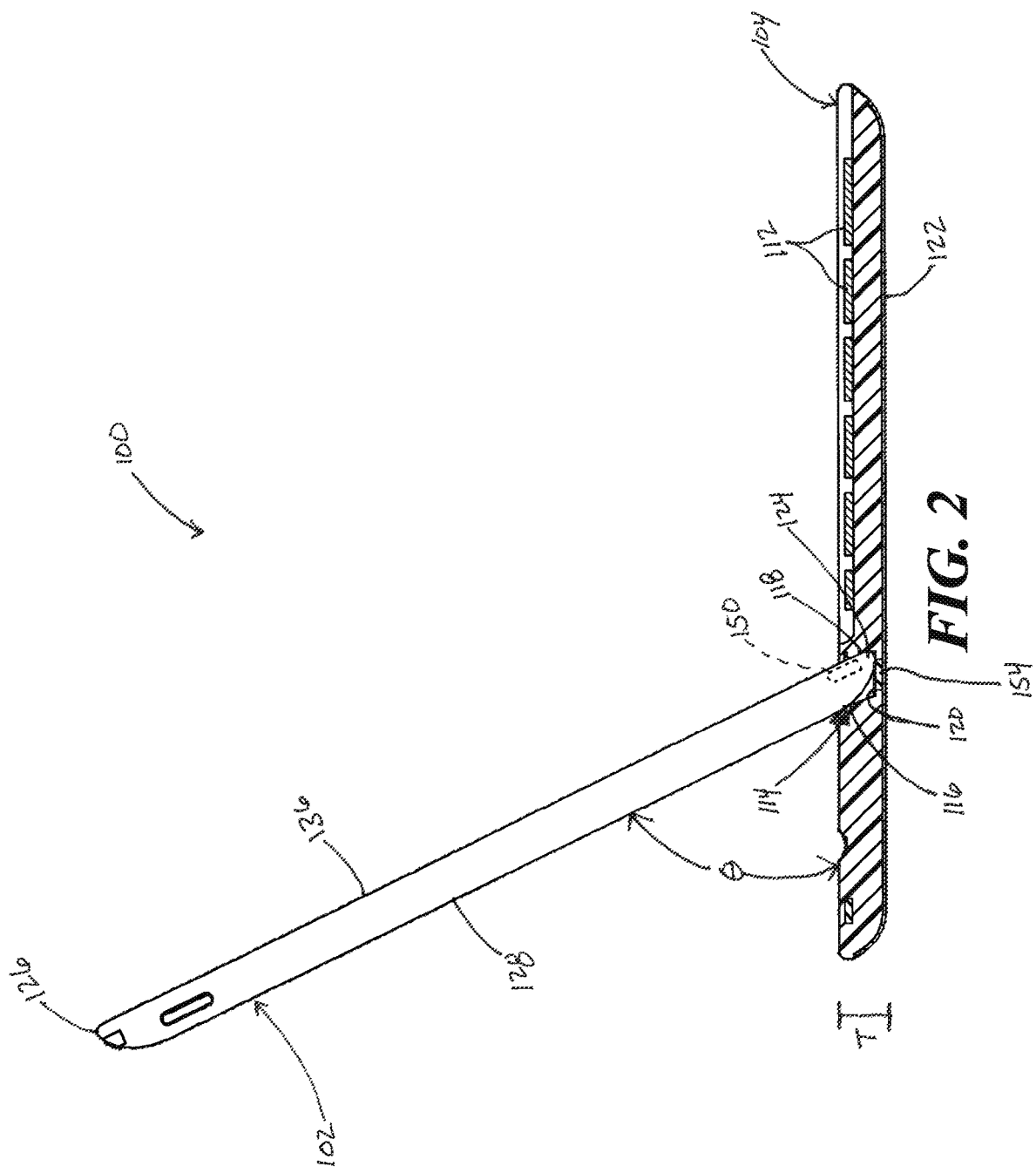
FIG. 2 is a partial cross-sectional side view of the embodiment of protective cover and portable electronic device shown in FIG. 1, illustrating features of an embodiment of support element of the protective cover, which support element holds the portable electronic device in the at least partially upright orientation.

FIGS. 1 and 2 illustrate an embodiment of a protective cover system 100. As shown, the protective cover system 100 may include a protective cover 104 configured (e.g., sized, shaped, etc.) for use with a portable electronic device 102. In some embodiments, the protective cover 104 may be configured for use with a particular type (e.g., brand, model, etc.) of portable electronic device 102.

The protective cover 104 may include one or more accessories 106. In the illustrated embodiment, an accessory 106 of the protective cover 104 is illustrated as comprising a keyboard 110, although other types of accessories may be included in addition to, or instead of, a keyboard 110 (e.g., a wireless keyboard, etc.). The keyboard 110 may have any number of key layouts. For instance, the keyboard 110 may include any number of keys 112, and the keys 112 may be arranged in any desired pattern or other arrangement. For example, the keyboard 110 may include alphanumeric keys arranged in a QWERTY-style layout, while optionally including various keys for directional input, initiating different functions, and the like.

As shown in FIGS. 1 and 2, a protective cover system 100 may include a support element 108. A support element 108 may be configured to support a portable electronic device 102 in one or more inclined, at least partially upright, or working, orientations relative to a surface that supports the protective cover 104.

The support element 108 may be configured to receive a peripheral portion 124 of the portable electronic device 102 (including a peripheral edge of the portable electronic device 102). Accordingly, the slot 114 may have a width (i.e., a distance between its front surface 118 and its rear surface 116) that is about the same as or greater than the thickness of the peripheral portion 124 of the portable electronic device 102. The width of the slot 114 may be configured to enable the portable electronic device 102 to be readily inserted into and removed from the slot 114. In some embodiments, the slot 114 may be configured to receive the peripheral portions 124 of a plurality of differently configured portable electronic device 102. A configuration of the support element 108 and a configuration (e.g., a size, a shape, a weight, a weight distribution, etc.) of the protective cover 104 may hold the portable electronic device 102 in the at least partially upright orientation. In the at least partially upright orientation, a peripheral portion 126 of the portable electronic device 102 may be elevated above the protective cover 104.

In the illustrated embodiment, the support element 108 may include a slot 114 recessed in and extending laterally along at least a portion of a surface of the protective cover 104. In embodiments where the protective keyboard carries an accessory 106, the slot 114 may be located adjacent to the accessory. The slot 114 may be bounded by a rear surface 116, a front surface 118 and a base 120. The depth of the slot 114 is less than a thickness T of the protective cover 104; thus, the base 120 of the channel may be offset from, or located at a different elevation than, an outer surface 122 of the protective cover 104. In some embodiments, the depth of the slot 114 may be between about twenty-five percent to about seventy-five percent of the thickness T of the protective cover 104. In other embodiments, the depth of the slot 114 may be between about seventy-five percent to about ninety percent of the thickness T of the protective cover 104. In still other embodiments, the slot 114 may have a depth less than about twenty-five percent or greater than about ninety percent of the thickness T of the protective cover 104. In embodiments where the slot 114 does not extend completely across the protective cover 104, the slot 114 may extend substantially through the protective cover 104. Such a slot 114 may, therefore, lack a base 120.

As indicated previously herein, the support element 108 may be configured to support the portable electronic device 102 at an inclined angle or a perpendicular angle relative to a surface that supports the protective cover 104. The angle at which the support element 108 orients a portable electronic device 102 is represented in FIG. 2 as "angle θ," and may be defined by a number of factors, including, but not limited to, a configuration of the front surface 118 of the slot 114, an orientation of the front surface 118 of the slot 114, a configuration of the rear surface 116 of the slot 114, an orientation of the rear surface 116 of the slot 114, a distance between the front surface 118 and the rear surface 116 relative to a thickness of a portion of the electronic device 102 disposed within the slot 114, a depth of the slot 114, and any combination of these and/or other factors. In the embodiment depicted by FIG. 2, the rear surface 116 of the slot 114 defines at least a portion of a boundary of the slot 114 and is oriented such that the angle formed by the rear surface 116 and the base 120 is an obtuse angle. FIG. 2 also shows that the front surface 118 may be oriented at an acute angle relative to the base 120 of the slot 114.

The angle θ or angles at which a slot 114 orients an electronic device 102 may be defined, as desired. For instance, in some embodiments, the angle θ may be any angle from about forty-five degrees to about ninety degrees. In other embodiments, the angle θ may be any angle from about sixty degrees to about eighty-five degrees. In still other embodiments, the angle θ may be any angle from about seventy degrees to about eighty degrees. In further embodiments, the angle θ may be less than forty-five degrees or greater than ninety degrees.

In some embodiments, the slot 114 may be configured to orient a portable electronic device 102 at a plurality of different angles. As an example, a slot 114 may be configured to receive one or more inserts (not shown) that dictate the angle at which the portable electronic device 102 is oriented. As another example, a slot 114 may include different sections that are configured to orient the portable electronic device 102 at different angles from one another. Without limitation, a first section may be configured to orient a portable electronic device 102 of a first size or in a first orientation (e.g., portrait orientation) at a first angle, while second sections on opposite sides of the first section may be configured to orient a larger, second portable electronic device 102 or a portable electronic device 102 in a second orientation (e.g., landscape orientation) at a second angle.

With continued reference to FIG. 2, an embodiment of a method for causing the support element 108 (e.g., the slot 114, etc.) to engage and orient a portable electronic device 102 in an at least partially upright configuration may include orienting the portable electronic device 102 substantially perpendicular to the protective cover 104, and inserting the peripheral portion 124 of the portable electronic device 102 into the slot 114. With the peripheral portion 124 of the portable electronic device 102 in the slot 114, the portable electronic device 102 may be rotated about the peripheral portion 124 (e.g., in a counter-clockwise direction in the view provided by FIG. 2) to the illustrated inclined orientation. In such an orientation, a mechanical advantage or leverage of the portable electronic device 102 on the slot 114 may prevent or restrict additional counter-clockwise rotation of the portable electronic device 102, and even prevent movement (e.g., side-to-side movement, tilting, etc.) of the portable electronic device 102. Leverage may be created by, for instance, as features of the slot 114 engage the portable electronic device 102 at or near its peripheral portion 124, and as a rear surface 116 of the slot 114 engages at a location (e.g., a linear location, etc.) on the rear surface 116 of the portable electronic device 102.

As indicated previously herein, a configuration of the support element 108 and a configuration (e.g., a size, a shape, a weight, a weight distribution, etc.) of the protective cover 104 may hold the portable electronic device 102 in the at least partially upright orientation. Without limitation, the protective cover 104 may be weighted or otherwise configured to maintain the portable electronic device 102 in an upright position without tipping. Such weighting or other configuration may enable the protective cover system 100 to be self-supported when the protective cover 104 positions the portable electronic device 102 in an at least partially upright orientation. By way of illustration, the protective cover 104 may have sufficient mass to overcome such a moment, or may be selectively weighted to place the center of gravity of the protective cover 104 at a desirable location. For instance, the center of gravity of the protective cover 104 may be positioned near the forward side of the keyboard 110, which may counteract the moment created as the electronic device 102 is positioned in an at least partially upright orientation.

In some embodiments, in addition to the slot 114, which mechanically engages a peripheral portion 124 of a portable electronic device 102, a support element 108 may include additional features for securing the portable electronic device 102 in place. For instance, the support element 108 of a protective cover 104 may include one or more attachment features 154 (e.g., magnets, etc.), which, in the illustrated embodiment, may be located adjacent to the slot 114. The attachment feature 154 may, in some embodiments, be configured to mutually engage a complementarily configured feature, or attachment feature 150, at or near the peripheral portion 124 of the portable electronic device 102 (e.g., one or more corresponding magnets, etc.).

When the peripheral portion 124 of the portable electronic device 102 is placed within the slot 114, the complementary attachment features 154 may engage (e.g., be attracted to, etc.) each other. An attraction force may therefore act to maintain the peripheral portion 124 of the portable electronic device 102 within the slot 114, although such a force may be overcome by exerting a sufficient counteracting, or removal, force. In embodiments where the attachment features 150 and 154 comprise magnets, the polarities of the magnets may be arranged to facilitate positioning and, potentially, alignment of the portable electronic device 102 within the slot 114. A more detailed description of example embodiments of magnets and other attachment features is provided hereinafter with reference to FIGS. 3-6.

The portable electronic device 102 may be used and maintained at any number of predetermined orientations or positions relative to the protective cover 104, including the accessory 106. As discussed above, for instance, the portable electronic device 102 may be maintained in a fully or partially upright working position relative to the protective cover 104. In other embodiments, however, the portable electronic device 102 may be separated from the protective cover 104. When separated, the portable electronic device 102 may be used without the accessory 106 (e.g., the keyboard 110, etc.) of the protective cover 104, although in other embodiments the accessory 106 may still be used in connection with the portable electronic device 102 when the portable electronic device 102 and the protective cover 104 have been separated from each other. In still other embodiments, the protective cover 104 may be placed over the display surface 136 of the portable electronic device 102 so as to shield the display surface 136 and, thus, provide a protected configuration during storage or transportation of the portable electronic device 102.

It should be appreciated that the support element 108 may have any number of different configurations. For instance, while the support element 108 is illustrated as including a slot 114 recessed in a surface of the protective cover 104, the support element 108 may alternatively include features that protrude from a surface of the protective cover 104, retractable members or other elements that may be used to at least partially support a portable electronic device 102 in an at least partially upright orientation relative to a surface upon which the protective cover 104 is located.

Figure 3:
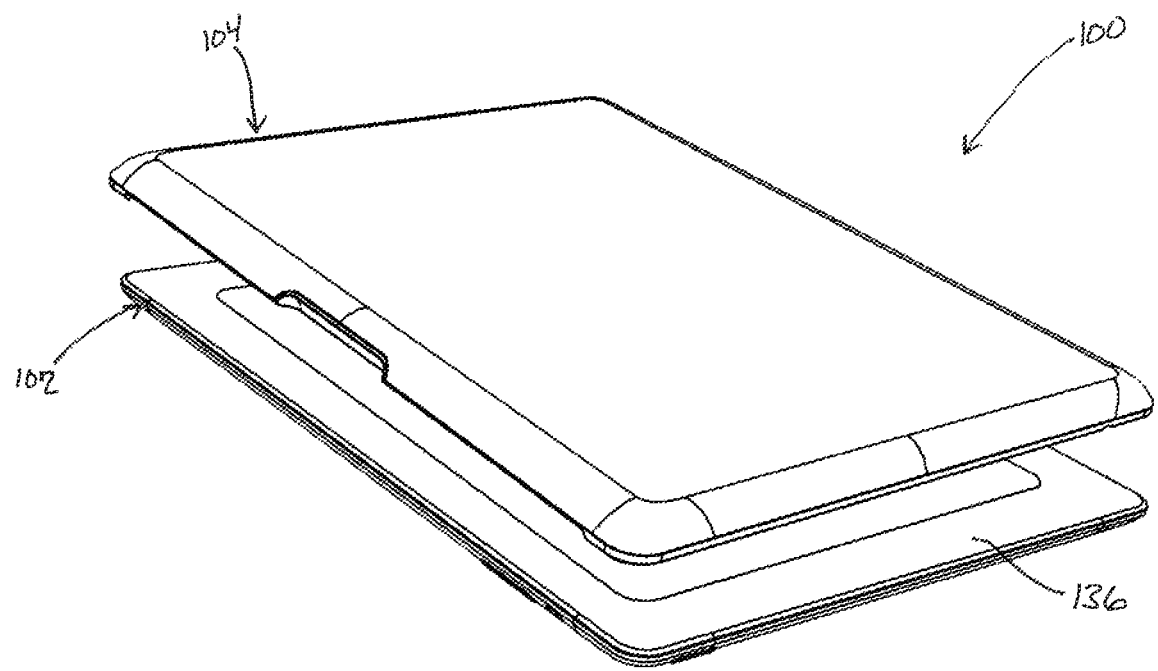
FIG. 3 is a perspective view of the embodiment of protective cover illustrated by FIG. 1, with the protective cover positioned over a display surface of the portable electronic device.

FIG. 3 illustrates an embodiment in which the protective cover 104 is oriented over and aligned with, but spaced apart from, a portable electronic device 102. An interior surface of the protective cover 104, in which the slot 114 is formed and which carries keyboard 110, are oriented towards (i.e., face) a display surface 136 of the portable electronic device 102.

Figure 4:
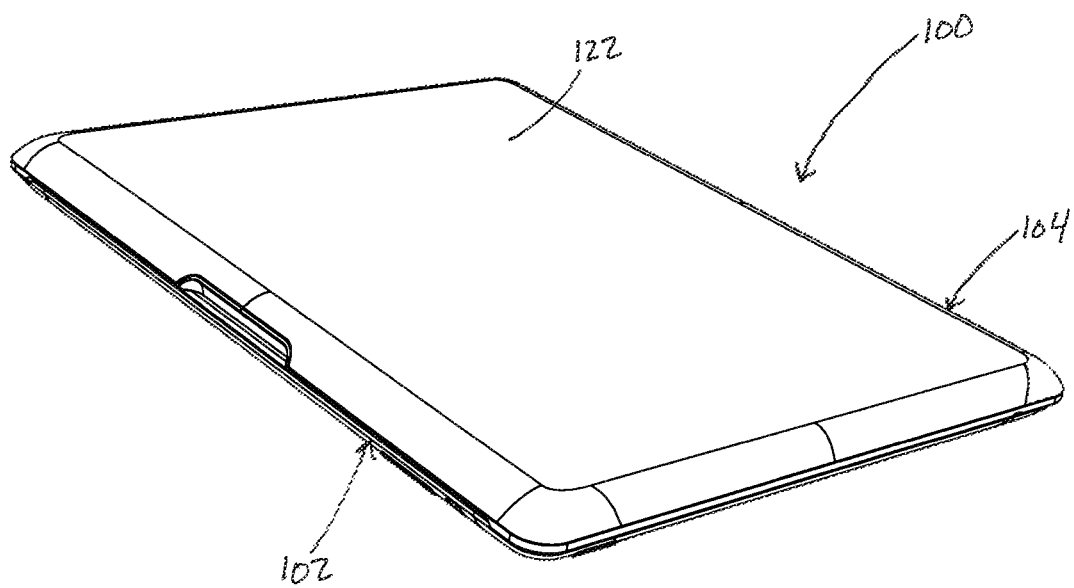
FIG. 4 is a perspective view of the embodiment of protective cover shown in FIG. 1 installed on and secured in place relative to the display surface of the portable electronic device in a closed, storage position.

With the protective cover 104 oriented adjacent to and aligned with the display surface 136 of the portable electronic device 102, the protective cover 104 may contact with the display surface 136, as shown in FIG. 4. This arrangement substantially covers or fully covers and, thus, protects the display surface 136 (FIG. 3) and, thus, places the portable electronic device 102 in a protected configuration.

Figure 5:
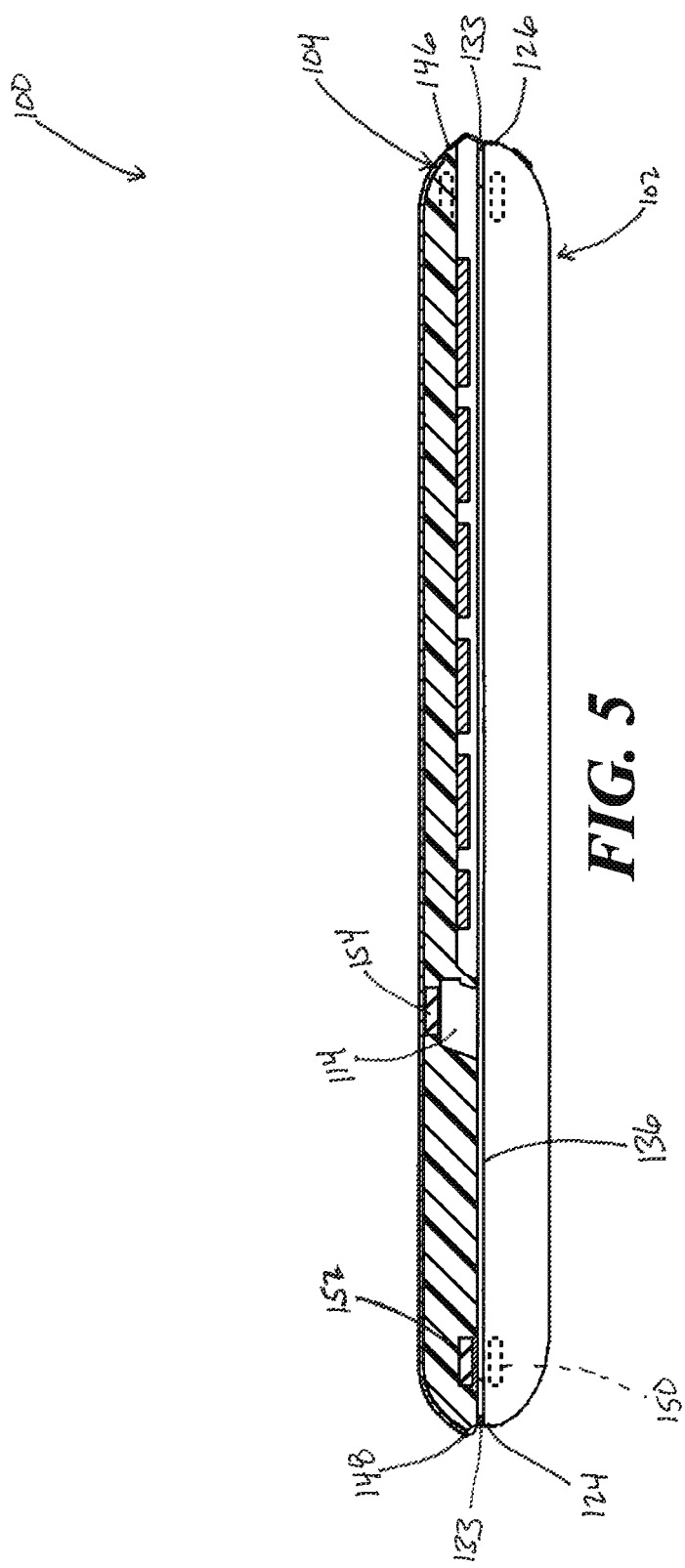
FIG. 5 is a partial cross-sectional view of the assembly depicted by FIG. 4, with the protective cover in the closed, storage position.

FIG. 5 is a partial cross-sectional view of the assembled arrangement of the embodiment of protective cover system 100 shown in FIG. 4, in which the portable electronic device 102 is protected. In accordance with some embodiments, the display surface 136 may be in contact with at least a portion of the interior surface of the protective cover 104, and can be substantially covered by the protective cover 104. As a result, while the protective cover 104 is in place, as shown in FIGS. 4 and 5, it may be difficult for an object other than the protective cover 104 to contact the display surface 136.

In addition, FIG. 5 shows that features of an accessory 106 carried by the interior surface of the protective cover 104, such as the outer surfaces of keys of a keyboard 110, may not contact the display surface 136 of the portable electronic device 102. In some embodiments, such as that depicted by FIG. 5, an outer surface of an accessory 106 of the protective cover 104 may be recessed relative to the interior surface of the protective cover 104. Alternatively, an outer surface of an accessory 106 of the protective cover 104 may be coplanar or substantially coplanar with the interior surface of the protective cover 104.

FIG. 5 illustrates aspects of an embodiment of an attachment system for securing the protective cover 104 to the portable electronic device 102, and for optionally aligning the protective cover 104 relative to the portable electronic device 102. In particular, the illustrated embodiment of illustrates a set of two attachment elements 150 and 152. A first attachment element 150 is part of (e.g., located within, etc.) or otherwise carried by the portable electronic device 102. A second attachment element 152 is part of (e.g., located within, etc.) or otherwise carried by the protective cover 104. More particularly, in the illustrated embodiment, the first and second attachment elements 150 and 152 are located at or adjacent to peripheral portions 124, 148 of the portable electronic device 102 and the protective cover 104, respectively.

In the orientation illustrated by FIG. 4, the second attachment element 152 is shown to be vertically offset from the first attachment element 150. The distance of such a vertical offset may be sufficient for attachment forces to be present between the attachment elements 150 and 152. For instance, the attachment elements 150 and 152 may comprise magnets oriented to have opposite polarities directed toward each other. Thus, the attachment element 150 may include a magnet with a North polarity directed toward the protective cover 104, while its corresponding attachment element 152 may include a magnet with a South polarity directed toward the portable electronic device 102.

In the illustrated embodiment, attachment elements 150 and 152 may be positioned at or adjacent to opposite sides of the display surface 136. In one embodiment, the attachment elements 150 and 152 may be centered relative to each other. In other embodiments, for instance, complementary attachment elements 150 and 152 may be laterally offset from one another. Such a lateral offset may be along the widths and/or lengths of the portable electronic device 102 and protective cover 104. In such an embodiment, an attraction force between the attachment elements 150 and 152 may be angled in one or more dimensions relative to the display surface 136.

While the illustrated protective cover 104 and portable electronic device 102 are shown as having about the same dimensions and footprints, another embodiment contemplates the protective cover 104 having a larger size in one or more dimensions than a portable electronic device 102 within which the protective cover 104 is configured to be used. A larger footprint may be provided by including a hinge, attachment feature, or other component that extends or is extendable at least partially outward relative to the peripheral portions 124 and 126 of the portable electronic device 102. In such an embodiment, the attachment element 152 could be included in the extended feature and be positioned outward relative to the portable electronic device 102. An attraction force between the attachment elements 150 and 152 may, in such a case, be directed fully or partially through peripheral edges of the portable electronic device 102. In other embodiments, however, such as that illustrated by FIG. 5, the attraction forces between the attachment elements 150 and 152 may be hingeless and/or directed solely through the display surface 136, without being directed through a peripheral or side surface of the portable electronic device 102.

According to embodiments in which each attachment element 150, 152 includes one or more magnets, magnetic forces may act as the primary or sole forces that secure the protective cover 104 in place over the display surface 136 of the portable electronic device 102. As used herein, terms such as "sole," "only", and the like, as well as their derivatives, when used relative to attachment forces and mechanisms, are intended to exclude consideration of more nominal factors such as sliding friction, environmental factors and other similar conditions. More particularly, an embodiment using magnets to secure the protective cover 104 to the portable electronic device 102 may be considered to use magnets as the "sole" or "only" attachment feature despite the presence of frictional, gravitational, or other similar resistance.

Where the attachment elements 150 and 152 comprise magnets, any suitable type of magnet may be used. For instance, the magnets may be permanent magnets, including rare-earth magnets. Example rare-earth magnets may include lanthanide series elements having atomic numbers 57-71. Other suitable magnets may include ceramic or ferrite magnets, AlNiCo magnets, injection-molded magnets, ferrite magnets, or any other suitable type of magnet or material with a sufficiently strong magnetic field or the ability to be attracted to a magnetic field.

Optionally, the protective cover 104 can provide protection without significantly adding to the dimensions of the portable electronic device 102. Without limiting the scope of the present disclosure, when a protective cover 104 is assembled with the portable electronic device 102 in a closed or protected arrangement, the protective cover 104 may increase a thickness of the portable electronic device 102. Nonetheless, the thickness of the resulting assembly may be minimized so as not to add significantly to the thickness of the portable electronic device 102. In some embodiments, assembly of a protective cover 104 with a portable electronic device 102 may add no more than about three-eighths of an inch (about 9.5 mm) or even less than about one quarter of an inch (about 6.4 mm) to the thickness of the portable electronic device 102. These dimensions are, however, merely examples of some suitable dimensions. For instance, in other embodiments, a protective cover 104 according to the present disclosure may add less than about three-sixteenths of an inch (about 4.8 mm) to the thickness of the portable electronic device 102, although the added thickness could in other embodiments be greater than three-eighths of an inch (about 9.52 mm).

Figure 6:
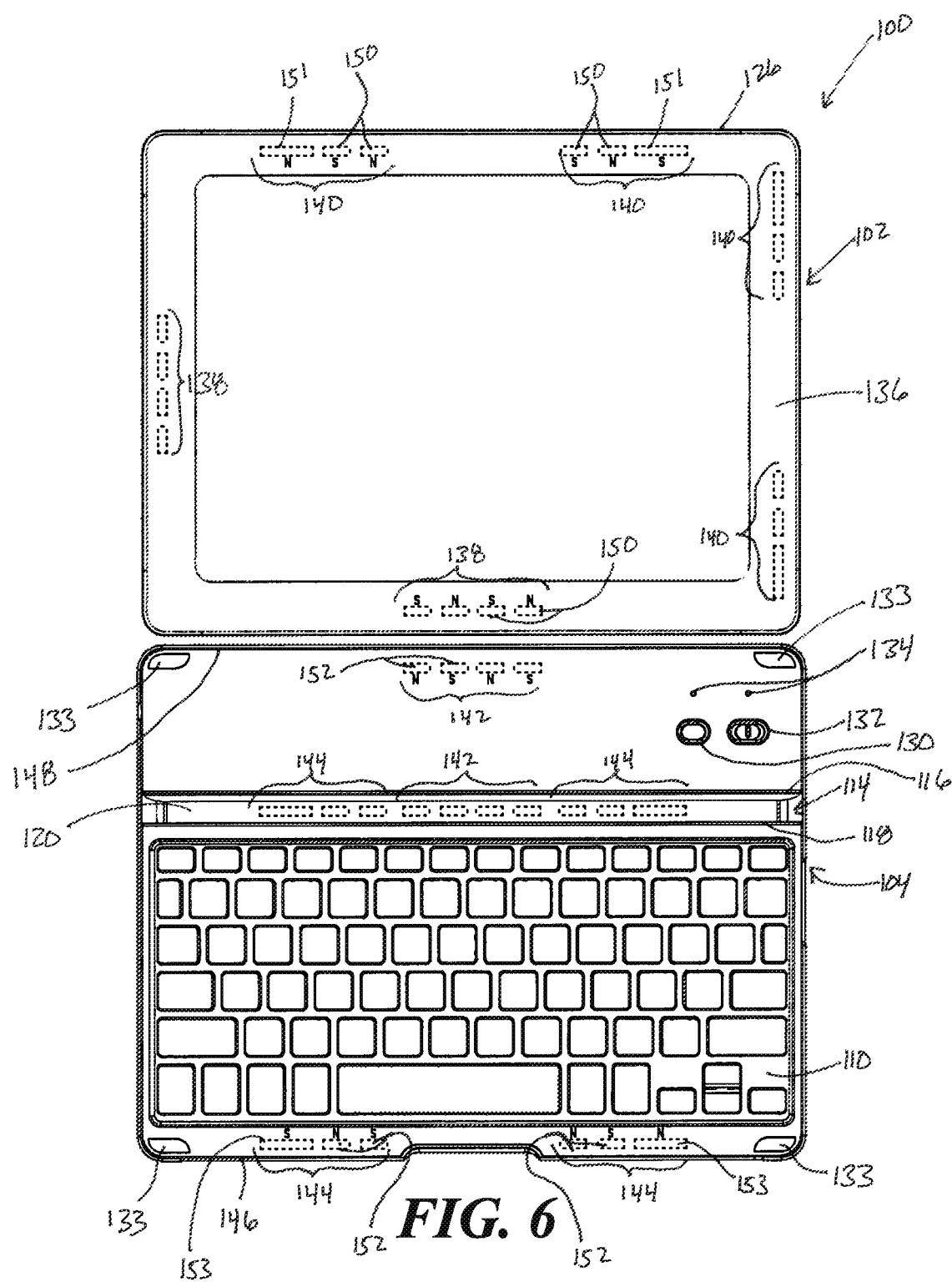
FIG. 6 is a top plan view of the embodiments of protective cover and portable electronic device illustrated by FIG. 1, arranged side-by-side and showing an embodiment of an interior surface of the protective cover, which is configured to be positioned over and against the display surface of the portable electronic device, and the display surface of the portable electronic device.

While FIG. 5 illustrates the attachment elements 150 and 152 as being positioned at or adjacent to peripheral portions 124, 148 of the portable electronic device 102 and the protective cover 104, respectively, such an embodiment is merely illustrative. In other embodiments, the attachment components 150, 152 or other features may instead or additionally be located at or adjacent to opposite peripheral portions 126 and 146 of the portable electronic device 102 and the protective cover 104, respectively. Indeed, as depicted by FIG. 6, magnets may be located at or near opposite peripheral portions 126 and 146 of both the portable electronic device 102 and the protective cover 104. In such an embodiment, the protective cover 104 may be secured in place over the display surface 136 of the portable electronic device 102 by using magnets or other components proximate each of two opposite peripheral portions of the portable electronic device 102 (e.g., at or near both peripheral portion 124 and peripheral portion 126).

Referring now to FIG. 6, the protective cover system 100 of FIGS. 1-5 is shown with the protective cover 104 being separated from the portable electronic device 102.

As shown in FIG. 6, the attachment elements 150, 152 of the portable electronic device 102 and the protective cover 104 may be arranged in groups, which are referred to herein as "attachment features." The portable electronic device 102 may include two or more attachment features 138 and 140, and the protective cover 104 may include two or more corresponding attachment features 142 and 144. Each attachment feature 138, 140, 142, 144 may include one or more components, such as attachment elements 150, 152. In accordance with one embodiment, the attachment features 138, 140, 142, 144 are configured to magnetically secure the protective cover 104 to the portable electronic device 102, to maintain the protective cover 104 in place over the display surface 136 of the portable electronic device 102 in one or more orientations or configurations, and/or to facilitate proper alignment of the protective cover 104 with the portable electronic device 102.

The illustrated attachment features 138, 140, 142, 144 may have any suitable configuration. As an example, attachment feature 138 may include four spaced apart magnets of about the same size (e.g., attachment elements 150) as one another. In contrast, attachment feature 140 may include three spaced apart magnets, optionally including magnets of different sizes (from each other, from the magnets of attachment feature 138, etc.) (e.g., attachment elements 150, 152). The attachment features 142 and 144 of the protective cover 104 may be positioned and configured to correspond to associated features of the portable electronic device 102. Thus, the attachment feature 142 may be positioned and have an arrangement that generally corresponds to the position and arrangement of attachment feature 138, while the attachment feature 144 may be positioned and arranged in a manner that generally corresponds to the position and arrangement of the attachment feature 140.

The attachment features 138 and 140 are illustrated as being located in the portable electronic device 102 and at or near a respective peripheral portion 124, 126 thereof. The attachment features 138 and 140 are shown in phantom lines as their position may be on or below the display surface 136, as shown in FIG. 5. Some or all of the attachment features 142 and 144 of the protective cover 104 may be configured to interact with corresponding attachment features 138 and 140 of the portable electronic device 102. In particular, in the illustrated embodiment, the protective cover 104 is illustrated as including two attachment features 144 at or near a peripheral portion 146, and one attachment feature 142 at or near a peripheral portion 148 of the protective cover 104.

If the protective cover 104 is flipped over from the illustrated view and placed over the display surface 136 of the portable electronic device 102 (see FIG. 3), the attachment features 138 of the portable electronic device 102 may be aligned with the corresponding attachment feature 142 of the protective cover 104. Similarly, the other attachment feature 140 of the portable electronic device 102 may be aligned with the corresponding attachment feature 144 of the protective cover 104. According to some embodiments, when the attachment features 138 and 140 are aligned with corresponding attachment features 142 and 144, the adjacent attachment features 138 and 142, 140 and 144 may engage each other (e.g., magnetically, etc.) To hold the interior surface of the protective cover 104 against the display surface 136 of the portable electronic device 102.

In accordance with a specific embodiment, an attachment feature 138, 140, 142, 144 may include multiple magnets, and different magnets in the same attachment feature 138, 140, 142, 144 may have an opposite polarity. Thus, one magnet may have be oriented in one direction (e.g., a North pole oriented towards the display surface 136 of the portable electronic device 102 or towards the interior surface of the protective cover 104, etc.) while one or more other magnets have an opposing orientation (e.g., a South pole oriented towards the corresponding display surface 136 or interior surface of the protective cover 104, etc.). In some cases, adjacent magnets have opposite polarities.

FIG. 6 illustrates an embodiment in which the attachment features 138, 140, 142, 144 include magnets that have opposing polarities. As an example, the attachment feature 138 of the portable electronic device 102 includes magnets (i.e., an embodiment of attachment element 150) of alternating polarity (e.g., South/North/South/North, etc.). Similarly, the complementary attachment feature 142 of the protective cover 104 may also include magnets of alternating polarity (e.g., North/South/North or South/North/South). According to at least some embodiments, the arrangements of polarities of magnets of the attachment features 142 and 144 of the protective cover 104 (e.g., North/South/North/South) may be opposite and, thus, complementary to (as opposite magnetic polarities attract) the arrangement of polarities of corresponding attachment features 138 and 140 of the portable electronic device 102 (e.g., South/North/South/North). Such an embodiment is generally illustrated in FIG. 6.

Inasmuch as same polarities repel, the alternating or otherwise varying polarities of the attachment elements 150-153 may facilitate alignment of the protective cover 104 relative to the portable electronic device 102. More particularly, two magnets having the same polarity (e.g., South/South or North/North) repel each other. Such repulsion may resist or even prevent the protective cover 104 being secured in a misaligned position over the display surface 136 of the portable electronic device 102. Optionally, a repellent force may help shift the position of the protective cover 104 relative to the portable electronic device 102 to align two opposite polarity magnets (e.g., North/South or South/North). In some embodiments, repellant forces assist in repositioning the protective cover to a natural position where attraction forces facilitate attachment (e.g., where no magnets are opposed to a corresponding magnet of the same polarity, etc.).

In some embodiments, the protective cover 104 may be an after-market product or otherwise available to correspond to a particular type (e.g., brand, model, etc.) of portable electronic device 102. The attachment features 142, 144 of the protective cover 104 may be configured specifically for use with (e.g., complementary to, etc.) the configuration of attachment features 138, 140 of that particular type of portable electronic device 102.

In addition to the attachment features 142, 144 being used to attach the protective cover 104 over the display surface 136 of the portable electronic device 102, the attachment features 142, 144 may also provide additional or other functionality. For instance, when the portable electronic device 102 is positioned in an orientation such as that illustrated by FIGS. 4 and 5, the portable electronic device 102 may not be configured for use (i.e., its display is not accessible). The portable electronic device 102 may, for instance, have a sleep mode or powered-down mode that can be activated when the protective cover 104 is properly positioned over the display screen 136 of the portable electronic device 102. Interaction between one or more attachment features 142, 144 of the protective cover 104 and one or more corresponding attachment features 138, 140 of the portable electronic device 102 may disable use of the portable electronic device 102 (e.g., through a "sleep" mode, by powering down, or turning off power, etc.) in a manner known in the art and, thus, conserve power.

Conversely, when the peripheral portion 124 of the portable electronic device 102 is engaged by the slot 114, interaction between the attachment features 138, 140 of the portable electronic device 102 and an attachment feature 142, 144 of the protective cover 104 adjacent to the slot 114 may activate the portable electronic device 102 (e.g., "wake" it, power it up, etc.).

The accessory 106 may include other or additional features, such as a power control input 132, an embodiment of which is also shown in FIG. 6. The power control input 132 may be used to place the accessory 106 in an on or off state. Such a power control input 132 may be linked to a power supply (e.g., AC power supply, DC battery, etc.) to selectively provide power to processors, communication busses, circuit components, or other features that may use power to operate. In some embodiments, the accessory 106 may include a keyboard 110 as described herein, and power may be required to transfer signals produced using the keyboard 110, to power backlighting in the keyboard 110, or for other purposes. The power control input 132 may take the form of a button, switch, toggle, or other component, or any combination of the foregoing. Where the power control input 132 is a toggle or switch, a user may move the toggle or switch between at least two positions, including an "off" position and an "on" position. When the power control input 132 is in the "on" position, the accessory 106 may be able to use power to operate various components, including the keyboard 110.

While the accessory 106 is illustrated as including a keyboard 110, the accessory 106 may include any number of additional or other devices or features. For instance, other accessories usable in connection with embodiments of the present disclosure may include any combination of: batteries or other power sources configured to provide primary or backup power for a computing device; audio devices (e.g., speakers, microphones, turntables, mixers, etc.); printers; scanners; peripheral storage or memory devices (e.g., disk drives, hard drives, solid state storage devices, etc.); communication elements configured to provide a computing device with alternate and/or additional means of communication (e.g., USB or USB micro ports, HDMI ports, FireWire interfaces, i.LINK interfaces, Lynx interfaces, 8P8C jacks, etc.); or other devices or accessories or any combination of the foregoing.

An additional aspect illustrated in FIG. 6 is a cushioning feature 133. The cushioning feature 133 may provided to engage the display surface 136 when the portable electronic device 102 is in a closed or storage configuration. The cushioning feature 133 may therefore be located on an interior surface of the protective cover 104. As discussed herein, the protective cover 104 may be placed over the display surface 136 of the portable electronic device 102. The cushioning features 133 may be formed and located so as to absorb any shock generated by impact on the protective cover 104, or to reduce the total surface area over which contact occurs between the display surface 136 and the protective cover 104. Thus, in the illustrated embodiment, four cushioning features 133 are shown at positions to correspond to the corners of the display surface 136 of the portable electronic device 102. In some embodiments, the cushioning features 133 may be located at one or more positions that correspond to a bezel or other location rather than to a display screen on the display surface 136, although the cushioning features 133 could also be located to contact the display screen.

The cushioning features 133 may comprise a compressible, resilient material. A variety of materials possess desirable characteristics for the cushioning features 133. These materials include, but are not limited to, ethylene-vinyl acetate (EVA) foam (which is commonly referred to as "foam rubber" and as "expanded rubber"), polyurethane foam (e.g., microcellular polyurethane foam; fine-celled, low compression-set, high density polyurethane foam; etc.), neoprene and a variety of other compressible, resilient materials. In some embodiments, the protective cover 104 may include a liner or cushioning material covering all or a substantial portion of an interior surface thereof, and such a material may engage against the display surface 136, including the display screen, of the portable electronic device 102 and absorb shock generated by impact on the protective cover 104 or the portable electronic device 102.

As will be appreciated in view of the disclosure herein, the accessory 106 may include other aspects, take other forms, or have other components or features. For instance, one or more ports or other inputs may be provided. As an example, the accessory 106 may use an additional or alternative wired connection (e.g., USB, serial, etc.) that is configured to communicatively couple the keyboard 110 to a power source and/or to an electronic device. A port or input may be provided to allow power to be provided or to allow communication to be provided to the electronic device. Still other ports, inputs, outputs, and the like may also be provided. As an example, an input to selectively turn backlighting on or off may be included. Additionally, or alternatively, inputs to change communication protocols may be provided. In some embodiments, indicators 134, such as lights or other components may be provided as outputs. Such indicators 134 may show a status of certain features, including connectivity, power, backlighting, or other status of the accessory 106.

Although the foregoing description provides many specifics, these should not be construed as limiting the scope of any of the appended claims, but merely as providing information pertinent to some specific embodiments that may fall within the scopes of the appended claims. Other embodiments of the disclosed subject matter may also be devised which lie within the scopes of the appended claims. In addition, features from different embodiments may be employed in combination. The scope of each claim is indicated and limited only by its plain language and the legal equivalents to its elements. All additions, deletions, and modifications to the subject matter disclosed herein that fall within the scopes and meanings of the claims are to be embraced by the claims.

What is claimed is:

1. A keyboard for use with a plurality of differently configured devices from different manufacturers and having different capabilities, comprising:
   a base;
   a support element associated with the base, the support element consisting essentially of a slot bounded by a forward surface and an opposed rear surface, the forward surface and the opposed rear surface being planar surfaces oriented parallel to one another and spaced apart a distance that enables the slot to receive peripheral edges of any of the plurality of differently configured devices from different manufacturers and having different capabilities, the forward surface and the opposed rear surface located a single fixed distance apart from one another, enabling the slot to self-support the plurality of differently configured devices from different manufacturers and having different capabilities in working positions at angles of about 60° to about 85° to the base; and
   the keyboard carried by the base.

2. The keyboard of claim 1, further comprising:
   a device retention element complementary to an attachment element of a device of the plurality of differently devices from different manufacturers and having different capabilities to prevent a peripheral edge of the device from sliding laterally relative to the slot.

3. The keyboard of claim 2, wherein the device retention element and the attachment element associated with a display surface of the device can engage each other.

4. The keyboard of claim 3, wherein the device retention element consists of one or more magnets.

5. A keyboard for use with a plurality of differently configured devices from different manufacturers and having different capabilities, comprising:
   a base, including:
      a support element consisting essentially of a slot formed in an interior surface of the base, the slot including a forward surface and an opposed rear surface, the forward surface and the opposed rear surface being planar surfaces oriented parallel to one another and located a single fixed distance apart from each other, enabling the slot to:
         receive a peripheral edge of a device of any of the plurality of differently configured devices from different manufacturers and having different capabilities;
         hold the device, with the forward surface and the opposed rear surface engaging respective front and rear surfaces of the device adjacent to the peripheral edge; and
         self-support the device in a working orientation at an angle of about 45° to about 85° to the base; and
   the keyboard carried by the base.

6. The keyboard of claim 5, further comprising:
   a device retention element complementary to an attachment element of the device to prevent the peripheral edge of the device from sliding laterally relative to the slot.

7. The keyboard of claim 6, wherein the device retention element and the attachment element associated with the display surface of the device can engage each other.

8. The keyboard of claim 7, wherein the device retention element consists of one or more magnets.

9. A keyboard for use with a plurality of differently configured devices from different manufacturers and having different capabilities, comprising:
   a base; and
   a support element associated with the base, the support element consisting essentially of a slot, the slot including a forward surface and an opposed rear surface, the forward surface and the opposed rear surface being planar surfaces oriented parallel to one another and spaced apart a single fixed distance that enables the slot to:

receive a peripheral edge of a device of any of the plurality of differently configured devices from different manufacturers and having different capabilities;

hold the device, with the forward surface and the opposed rear surface of the slot engaging respective front and rear surfaces of the device adjacent to the peripheral edge; and self-support the device in a working orientation relative to the base.

10. The keyboard of claim 9, further comprising:
a device retention element complementary to an attachment element of the device to prevent the peripheral edge of the device from sliding laterally relative to the slot.

11. The keyboard of claim 10, wherein the device retention element and the attachment element associated with a display surface of the device can engage each other.

12. The keyboard of claim 11, wherein the device retention element consists of at least one magnet.

\* \* \* \* \*